(12) United States Patent
Ma et al.

(10) Patent No.: US 9,576,912 B1
(45) Date of Patent: Feb. 21, 2017

(54) WAFER LEVEL CHIP SCALE PACKAGE (WLCSP) HAVING EDGE PROTECTION

(71) Applicant: STMICROELECTRONICS PTE LTD, Singapore (SG)

(72) Inventors: Yiyi Ma, Singapore (SG); Kim-Yong Goh, Singapore (SG); Xueren Zhang, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 0 days.

(21) Appl. No.: 14/957,865

(22) Filed: Dec. 3, 2015

(51) Int. Cl.
  *H01L 23/12* (2006.01)
  *H01L 23/00* (2006.01)
  *H01L 23/31* (2006.01)

(52) U.S. Cl.
  CPC ......... *H01L 23/562* (2013.01); *H01L 23/3171* (2013.01); *H01L 24/03* (2013.01); *H01L 24/06* (2013.01); *H01L 24/14* (2013.01); *H01L 24/81* (2013.01); *H01L 2224/02371* (2013.01)

(58) Field of Classification Search
  CPC .... H01L 23/562; H01L 23/3171; H01L 24/03; H01L 24/06; H01L 24/14; H01L 24/81
  USPC ........................................................ 257/737
  See application file for complete search history.

(56) References Cited

U.S. PATENT DOCUMENTS

| 6,713,870 | B2 | 3/2004 | Fang | |
|---|---|---|---|---|
| 7,241,643 | B1 | 7/2007 | Kelkar et al. | |
| 7,462,937 | B2 * | 12/2008 | Hanaoka | H01L 23/3114 257/737 |
| 7,622,309 | B2 | 11/2009 | Su et al. | |
| 7,632,719 | B2 | 12/2009 | Choi et al. | |
| 7,714,448 | B2 * | 5/2010 | Miyata | H01L 23/3114 257/778 |
| 8,125,054 | B2 | 2/2012 | West et al. | |
| 8,164,179 | B2 | 4/2012 | Goh et al. | |
| 8,294,264 | B2 | 10/2012 | Wang et al. | |
| 8,389,335 | B2 | 3/2013 | Goh et al. | |
| 8,456,002 | B2 * | 6/2013 | Lin | H01L 21/568 257/723 |
| 9,337,154 | B2 * | 5/2016 | Miao | H01L 23/562 |
| 2008/0164553 | A1 | 7/2008 | Lin et al. | |
| 2010/0078769 | A1 | 4/2010 | West et al. | |
| 2014/0291812 | A1 | 10/2014 | Goh et al. | |

OTHER PUBLICATIONS

Teutsch et al., "Wafer Level CSP Using Low Cost Electroless Redistribution Layer," 50th Electronic Components & Technology Conference; May 2000; 10 pages.

* cited by examiner

*Primary Examiner* — Luan C Thai
(74) *Attorney, Agent, or Firm* — Allen, Dyer, Doppelt, Milbrath & Gilchrist, P.A.

(57) ABSTRACT

A wafer level chip scale package (WLCSP) includes a semiconductor substrate, a back end of line (BEOL) layer on the semiconductor substrate and having a peripheral edge recessed inwardly from an adjacent peripheral edge of the semiconductor substrate. A first dielectric layer is over the BEOL layer and wraps around the peripheral edge of the BEOL layer. A redistribution layer is over the first dielectric layer and a second dielectric layer is over the redistribution layer.

15 Claims, 5 Drawing Sheets

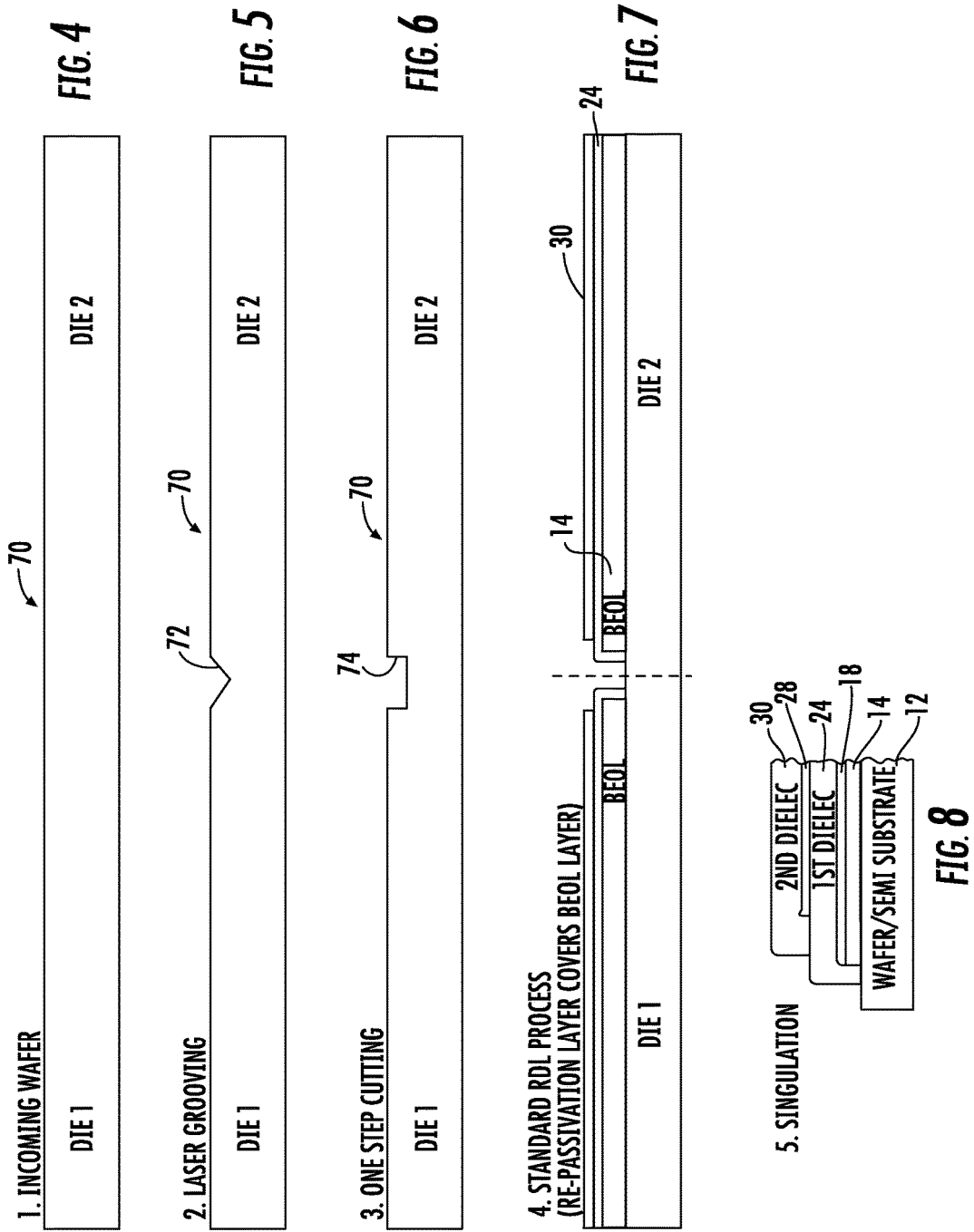

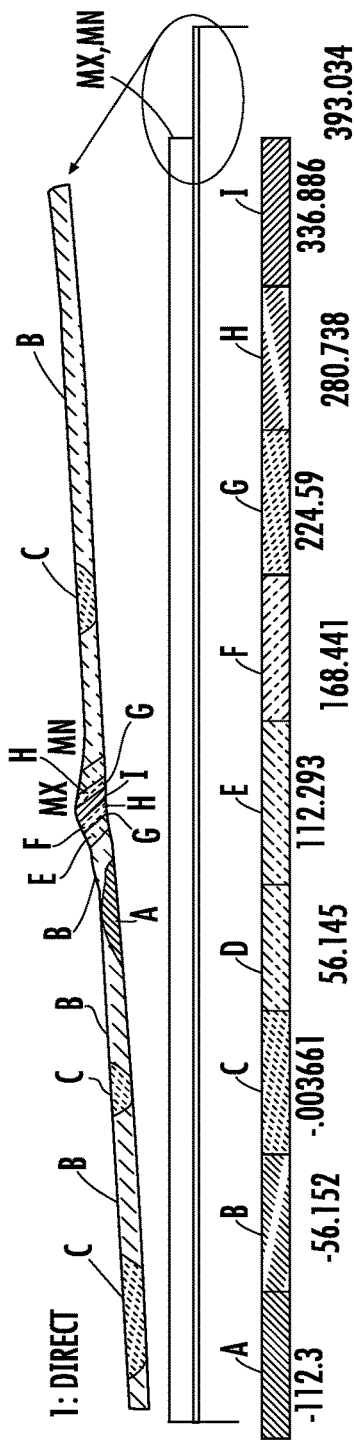
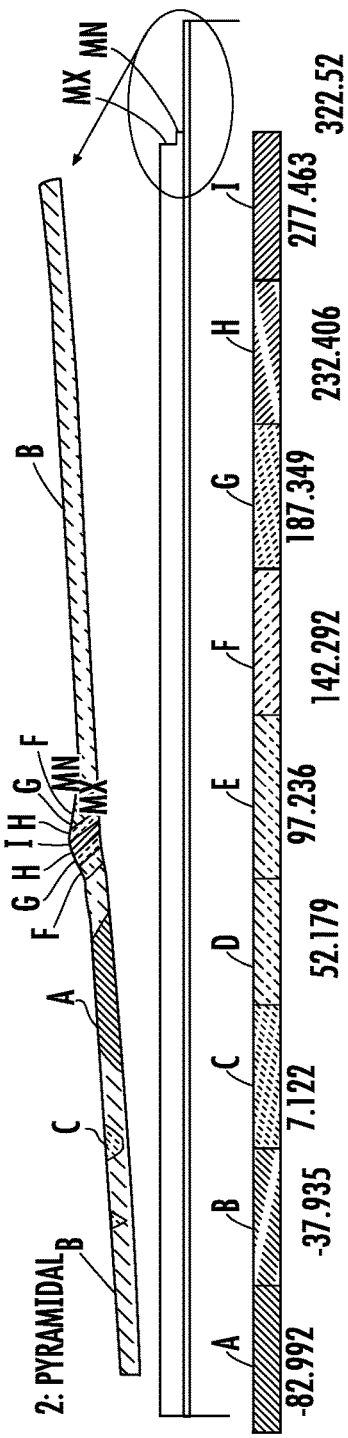
FIG. 9
FIG. 10

WAFER LEVEL CHIP SCALE PACKAGE (WLCSP) HAVING EDGE PROTECTION

TECHNICAL FIELD

The present disclosure relates to semiconductor packages, and more particularly, the present disclosure relates to a wafer level chip scale package having edge protection.

BACKGROUND

A wafer level chip scale package (WLCSP) is a small integrated circuit (IC) package typically used in mobile phones, personal digital assistants (PDA's), notebook computers, printers, and similar devices. A WLCSP usually has an area no greater than 1.2 times that of the IC die. It is a single-die, direct surface mountable package that may be secured to a printed circuit board (PCB) by conventional surface mount technology. The pads of the IC die connect to pads of the PCB through individual solder balls that typically require no underfill encapsulation and typically require no bond wires between the IC die and solder balls. This reduces the inductance between the IC die and the PCB and improves signal quality. The ball pitch is usually no more than 1 millimeter (mm). Pads are etched or printed directly onto the silicon wafer, resulting in a semiconductor package close to the size of the IC die. For that reason, it is given the name wafer level chip scale package.

Some WLCSP's are direct-bump designs, where the solder balls are placed directly above a bond pad on the die. Many WLCSP's, however, use a redistribution layer (RDL) as a copper or other metal interconnect layer applied after repassivation to route original bond pads to new solder ball locations that are not directly above the original bond pads. In RDL technology, the bare silicon wafer is repassivated with a polymer dielectric layer, but the original bond pads are left exposed. A copper redistribution layer is applied after repassivation to route the original bond pads to the new solder ball locations. A second polymer passivation or dielectric layer isolates the copper RDL layer. The die are singulated, i.e., cut, after the solder balls are placed.

A wafer level chip scale package typically includes a back end of line (BEOL) layer on the semiconductor substrate that is applied during a latter or "back end" part of the IC fabrication. Individual devices, including transistors, capacitors and resistors, are interconnected on the wafer. The BEOL layer includes contacts, insulating layers (dielectrics), metal levels, and bonding sites. As many as 3 to 10 layers may be added to form the BEOL layer. This is followed by applying passivation, first dielectric, RDL, and second dielectric layers. The repassivation layer and dielectric layers impart tensile stress at the edge of the BEOL layer, creating a risk of delamination near that edge. This results in device failure. It may be desirable to increase reliability by lowering the tensile stress at the edge of the BEOL layer.

SUMMARY

This summary is provided to introduce a selection of concepts that are further described below in the detailed description. Generally, a wafer level chip scale package (WLCSP) may comprise a semiconductor substrate and a back end of line (BEOL) layer on the semiconductor substrate and having a peripheral edge recessed inwardly from an adjacent peripheral edge of the semiconductor substrate. A first dielectric layer is over the BEOL layer and wraps around the peripheral edge of the BEOL layer. A redistribution layer is over the first dielectric layer and a second dielectric layer is over the redistribution layer.

The peripheral edge of the BEOL layer may be in compressive stress. The first dielectric layer may have a peripheral edge recessed inwardly from the adjacent peripheral edge of the semiconductor substrate. The second dielectric layer may have a peripheral edge recessed inwardly from an adjacent peripheral edge of the first dielectric layer.

The BEOL layer may comprise an uppermost passivation layer having a plurality of bond pad openings therein, and a plurality of bond pads with each bond pad exposed through a respective one of the plurality of bond pad openings. The second dielectric layer may have a plurality of solder ball openings therein. A plurality of solder balls may be included. Each solder ball may extend through a respective one of the plurality of solder ball openings. The redistribution layer may comprise a plurality of conductive traces with each conductive trace extending between a given bond pad and a corresponding solder ball. The semiconductor substrate may comprise silicon, for example.

A method for making a wafer level chip scale package (WLCSP) may comprise forming a back end of line (BEOL) layer on a semiconductor substrate and having a peripheral edge recessed inwardly from an adjacent peripheral edge of the semiconductor substrate. The method includes forming a first dielectric layer over the BEOL layer and wrapping around the peripheral edge of the BEOL layer. The method further includes forming a redistribution layer over the first dielectric layer and forming a second dielectric layer over the redistribution layer.

BRIEF DESCRIPTION OF THE DRAWINGS

Other objects, features and advantages will become apparent from the detailed description of which follows, when considered in light of the accompanying drawings in which:

FIG. 4 is a fragmentary sectional view of an incoming wafer as a step in manufacturing the WLCSP in accordance with a non-limiting example.

FIG. 5 is another fragmentary sectional view similar to FIG. 4 showing the step of laser grooving the wafer in accordance with a non-limiting example.

FIG. 6 is yet another fragmentary sectional view showing the step of saw cutting the laser groove in accordance with a non-limiting example.

FIG. 7 is another fragmentary sectional view showing the applied dielectric layers in accordance with a non-limiting example.

FIG. 8 is a fragmentary sectional view showing the end portion of the wafer after singulation in accordance with a non-limiting example.

FIG. 9 is a fragmentary sectional view of the end of a conventional WLCSP showing failure created by high tensile stress at the BEOL layer.

FIG. 10 is a fragmentary sectional view similar to FIG. 9 for another conventional WLCSP showing failure created by the high tensile stress at the BEOL layer.

DETAILED DESCRIPTION

Different embodiments will now be described more fully hereinafter with reference to the accompanying drawings, in which preferred embodiments are shown. Many different forms can be set forth and described embodiments should not be construed as limited to the embodiments set forth herein. Rather, these embodiments are provided so that this disclosure will be thorough and complete, and will fully convey the scope to those skilled in the art.

The wafer level chip scale package (WLCSP), in accordance with a non-limiting example, changes the stress at the edge of the back end of line (BEOL) layer from a tensile stress to a compressive stress using edge protection and lowers the risk of delamination. The stress under the repassivation and dielectric layers is significantly reduced, imparting a higher reliability to the WLCSP.

Figure 1:
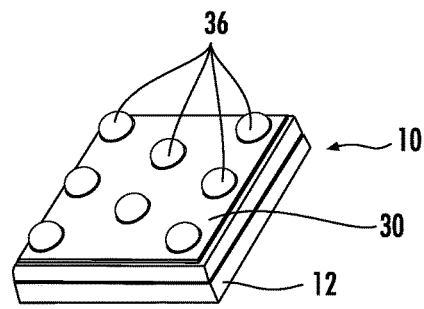
FIG. 1 is a perspective view of a wafer level chip scale package (WLCSP) in accordance with a non-limiting example.
Figure 2:
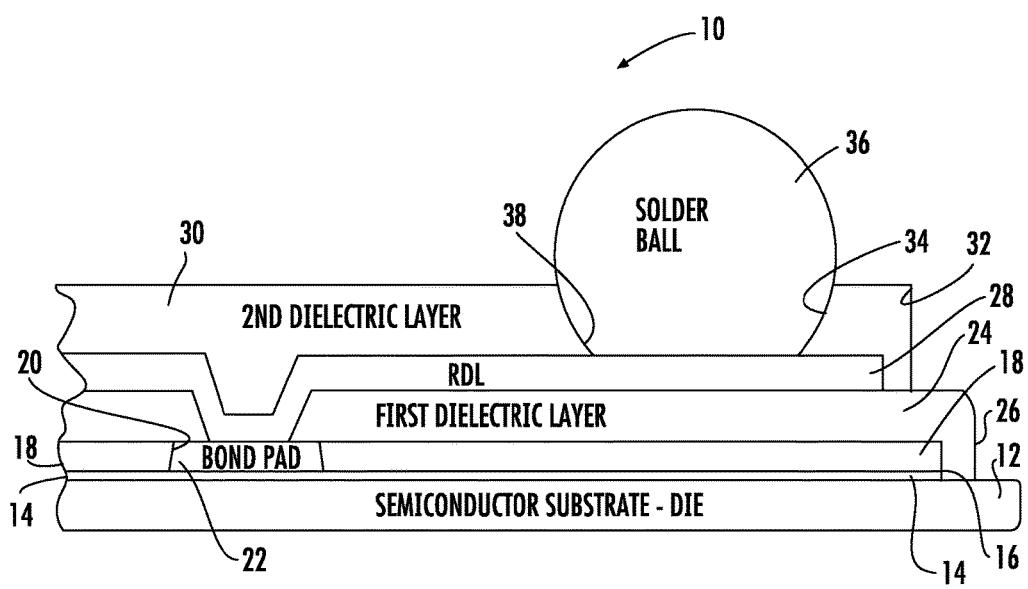
FIG. 2 is a sectional view of a portion of the WLCSP of FIG. 1 and showing the first dielectric layer wrapping around the peripheral edge of the BEOL layer in accordance with a non-limiting example.

An example WLCSP is shown generally at 10 in FIGS. 1 and 2. As illustrated, the WLCSP 10 includes a semiconductor substrate 12 formed of silicon as an integrated circuit (IC) die in this example. A back end of line (BEOL) layer 14 is on the semiconductor substrate 12 and has a peripheral edge 16 recessed inwardly from an adjacent peripheral edge of the semiconductor substrate as shown in FIG. 2. The BEOL layer 14 includes an uppermost passivation layer 18 having a plurality of openings 20. In the partial sectional view of FIG. 2, only one opening 20 is shown.

A plurality of bond pads 22 are positioned on the semiconductor substrate 12 at the BEOL layer 14 with one bond pad 22 illustrated in FIG. 2. Each bond pad 22 is exposed by a respective one of the plurality of bond pad openings 20. A first dielectric layer 24 is formed over the BEOL layer 14 and wraps around the peripheral edge 16 of the BEOL layer. This peripheral edge 16 of the BEOL layer 14 is in compressive stress as imparted by the first dielectric layer 24 wrapping around that peripheral edge 16. This first dielectric layer 24 has a peripheral edge 26 recessed inwardly from the adjacent peripheral edge of the semiconductor substrate 12. A redistribution layer (RDL) 28 is formed over the first dielectric layer 24. The first dielectric layer 24 is exposed at the bond pads 22 to allow the RDL 28 to contact the bond pads. A second dielectric layer 30 is formed over the RDL layer 28 and has a peripheral edge 32 recessed inwardly from the adjacent peripheral edge 26 of the first dielectric layer 14. The second dielectric layer has a plurality of openings 34 with one opening illustrated in FIG. 2.

As shown in FIG. 1, a plurality of solder balls 36 are carried by the WLCSP 10. Each solder ball 36 extends through a respective one of the plurality of solder ball openings 34 to form an array of solder balls that contact a printed circuit board (PCB). The redistribution layer 28 includes a plurality of conductive traces 38. Each conductive trace 30 extends between a given bond pad 22 and a corresponding solder ball 36 as shown in FIG. 2, showing one conductive trace in which an electrical contact is made between the solder ball 36 and the bond pad 22.

The upper passivation layer 18 and first and second dielectric layers 24,30 may be formed as spun-on layers or formed by other processing techniques known to those skilled in the art. The bond pad may be formed as a conventional aluminum bond pad or other alloy. The upper passivation layer 18 may be deposited over the substrate surface using semiconductor fabrication techniques known to those skilled in the art. That passivation layer 18 may be formed from polyimide, silicon nitride (SiN), $SiO_2$ or PSG (phosphosilicate glass). Other manufacturing techniques could include sputtering or other semiconductor manufacturing techniques known to those skilled in the art. The first and second dielectric layers 24,30 may be formed from polyimide or other dielectric materials known to those skilled in the art.

The upper passivation layer 18 and first dielectric layer 24 are removed adjacent the bond pad 22 to expose that bond pad and form the bond pad opening 20. The first dielectric layer 24 overlaps the upper passivation layer 18 at the bond pads 22, thus, sealing the edges at the bond pads. The upper passivation layer 18 and first dielectric layer 24 may each range from 3 to 10 microns in thickness, and in one example, each are about 5 to 7 microns. The RDL 28 is formed of copper in one example or may be formed from thin layers of deposited metals. Multiple metals may be used at the RDL 28 to meet the needs of adhesion, barrier, conductor and protection and may be patterned as conductors for relocation (redistribution) for the solder balls and contacts. Example metals may include titanium, copper, and nickel and may range from 3 to 4 microns thickness in one example and having a line width of about 25 microns.

Because the RDL 28 is metal and requires protection, the second dielectric layer 30 is deposited and later patterned. It is also about 3 to 10 microns thickness, but it can be thicker and up to about 20 microns or more in thickness depending on end use applications. That second dielectric layer 30 covers the area of the original bond pads 22 with an insulating layer and leaves exposed the metal of new bond pads on the traces 38 formed at the RDL 28. Solder balls 36 are deposited at the new bond pads at the traces 38 in a manner known to those skilled in the art as shown in FIG. 2. The solder balls 36 may vary in size, but in one example, are about 100 to 200 um. They can vary in size depending on final application and the PC board to which the WLCSP is surface mounted. The solder balls 36 can be formed of conventional lead and tin material as known to those skilled in the art, but in an example, other alloys may be used.

The WLCSP 10 shown in FIG. 1 is an example device, such as an EEPROM manufactured at the wafer level with an array of eight solder balls 36. The WLCSP may be used for many other types of devices and vary in size and number of solder balls forming the array. In this example, lead-free solder balls 36 may be manufactured using a SAC (SnAgCu) alloy with a near-eutectic melting point ranging from 217 to 221 degrees C. Thus, the WLCSP 10 is compatible with standard reflow processes. The solder ball 36 diameter may be chosen to permit a pick-and-place manufacturing process compatible with existing equipment useful with ball grid array (BGA) packages and compatible with PCB design rules for standard IC's. Devices available as a WLCSP 10 may be delivered in tape and reel packing with the solder balls 36 placed downward at the bottom of a carrier tape cavity. The WLCSP 10 example shown in FIG. 1 is about 1 millimeter (mm) by about 1 mm and about 0.30 mm to 0.58 mm thickness. Actual sizes can range depending on end use application and the size of the IC die.

Figure 3:
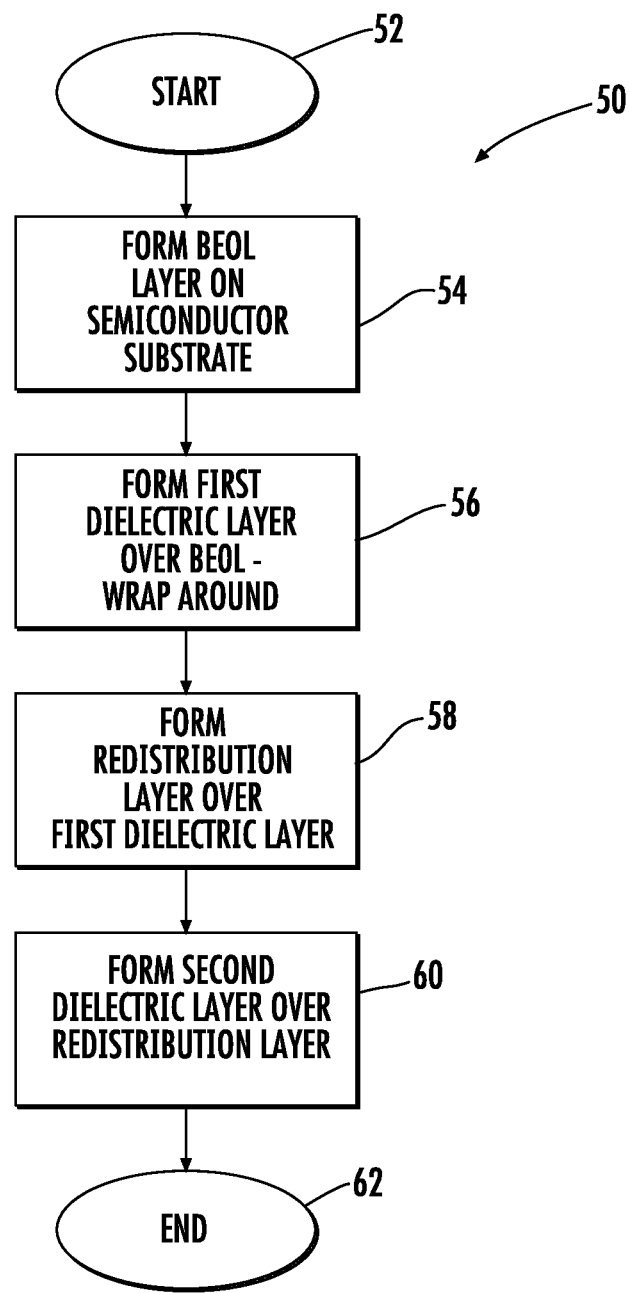
FIG. 3 is a high level flowchart showing a method of forming the WLCSP in accordance with a non-limiting example.

An example manufacturing method 50 is shown in FIG. 3. The process starts (block 52). A back end of line (BEOL) layer is formed on the semiconductor substrate and has a peripheral edge recessed inwardly from an adjacent peripheral edge of the semiconductor substrate (block 54). A first dielectric layer is formed over the BEOL layer and wraps around the peripheral edge of the BEOL layer (block 56). A redistribution layer is formed over the first dielectric layer (block 58). A second dielectric layer is formed over the redistribution layer (block 60). The process ends (block 62).

FIGS. 4-8 show a sequence of manufacturing steps for the WLCSP 10 from the semiconductor substrate formed as a semiconductor wafer 70 with a plurality of semiconductor die formed therein. Two die as Die 1 and Die 2 are illustrated. FIGS. 4, 5 and 6 are fragmentary sectional views of the semiconductor wafer 70 without showing the BEOL, passivation or dielectric layers. It should be understood that a large number of dies may be formed on the incoming wafer 70. A laser forms a groove 72 between two die as shown in FIG. 5. The laser groove may be a few microns in depth and width, for example, 3-10 microns. This is followed by one step cutting (FIG. 6) with a mechanical saw to form a saw kerf 74 between two die that is less than about 100 microns and ranges in an example from 50 to 100 microns in width and depth. FIG. 7 shows greater details of the first and second die, including the BEOL layer 14 and the first and second dielectric layers 24,30 applied onto the wafer. In the fragmentary illustration of FIG. 7, the RDL and upper passivation layers are not shown. The first dielectric layer 24 is applied over the BEOL layer 14 and wraps around the peripheral edge 16 of the BEOL layer 14. Although the passivation and dielectric layers 18, 24, 30 are usually about 3 to 10 microns, greater thicknesses can be used, up to about 10 to 20 microns depending on end use applications for the WLCSP 10. In certain examples, the first dielectric layer 24 at the edge to provide protection and impart compressive stress may be up to 100 microns, but this would be a more rare example. The enlarged side elevation view of FIG. 8 shows the redistribution layer 28 over the first dielectric layer 24 and the uppermost passivation layer 18 on the BEOL layer 14. The first dielectric layer 24 wraps around the peripheral edge 16 of the BEOL layer 14 as best shown in FIG. 8 to impart compressive stress and reduce delamination at the BEOL layer.

FIGS. 9 and 10 show the ends of a conventional WLCSP and failure created by high tensile stress at its BEOL layer. FIG. 9 shows a direct WLCSP design configuration, while FIG. 10 shows a pyramidal WLCSP design configuration. There is no overlap from a passivation or first dielectric layer at the BEOL layer in these designs. The numerical values are in megapascals and show the high tensile strain imparted at the MX/MN location, creating forces that cause delamination at the BEOL layer. The variation in megapascals along the edge and length is shown by the lettered indicia.

Figure 11:
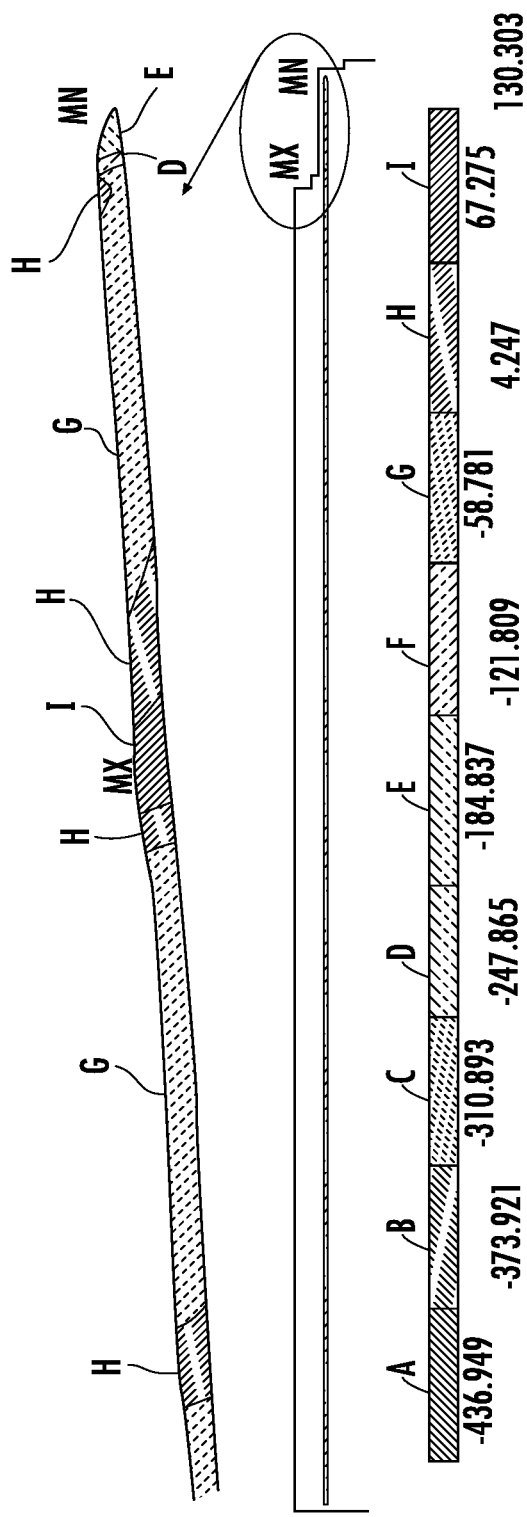
FIG. 11 is a fragmentary sectional view of the WLCSP in accordance with a non-limiting example and showing reduced stress at the BEOL layer in accordance with a non-limiting example.

FIG. 11 shows the WLCSP 10 with the edge protection in accordance with a non-limiting example, where the stress at the edge of BEOL layer changes from tensile to compressive and lowers the risk of delamination. There is therefore a much higher reliability in this WLCSP device.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A wafer level chip scale package (WLCSP) comprising:
a semiconductor substrate;
a back end of line (BEOL) layer on said semiconductor substrate, said BEOL layer comprising at least one insulating layer and an uppermost passivation layer, and having a peripheral edge recessed inwardly from an adjacent peripheral edge of said semiconductor substrate;
a first dielectric layer over said BEOL layer and wrapping around the peripheral edge of said BEOL layer to confine the peripheral edge of the BEOL layer in compressive stress and having a peripheral edge recessed inwardly from an adjacent peripheral edge of the semiconductor substrate;
a redistribution layer over said first dielectric layer; and
a second dielectric layer over said redistribution layer and having a peripheral edge recessed inwardly from the adjacent peripheral edge of the first dielectric layer.

2. The WLCSP according to claim 1 wherein said uppermost passivation layer has a plurality of bond pad openings therein, and a plurality of bond pads with each bond pad exposed through a respective one of said plurality of bond pad openings.

3. The WLCSP according to claim 2 further wherein said second dielectric layer has a plurality of solder ball openings therein; and further comprising a plurality of solder balls with each solder ball extending through a respective one of said plurality of solder ball openings.

4. The WLCSP according to claim 3 further wherein said redistribution layer comprises a plurality of conductive traces with each conductive trace extending between a given bond pad and a corresponding solder ball.

5. The WLCSP according to claim 1 further wherein said semiconductor substrate comprises silicon.

6. A wafer level chip scale package (WLCSP) comprising:
a semiconductor substrate;
a back end of line (BEOL) layer on said semiconductor substrate, said BEOL layer comprising at least one insulating layer and an uppermost passivation layer, and having a peripheral edge recessed inwardly from an adjacent peripheral edge of said semiconductor substrate;
a first dielectric layer over said BEOL layer and wrapping around the peripheral edge of said BEOL layer to confine the peripheral edge of the BEOL layer in compressive stress and having a peripheral edge recessed inwardly from an adjacent peripheral edge of said semiconductor substrate;
a redistribution layer over said first dielectric layer and having a peripheral edge; and
a second dielectric layer over said redistribution layer and wrapping around the peripheral edge of the redistribution layer and having a peripheral edge recessed inwardly from the adjacent peripheral edge of said first dielectric layer.

7. The WLCSP according to claim 6 wherein said uppermost passivation layer has a plurality of bond pad openings therein, and a plurality of bond pads with each bond pad exposed through a respective one of said plurality of bond pad openings.

8. The WLCSP according to claim 7 further wherein said second dielectric layer has a plurality of solder ball openings therein; and further comprising a plurality of solder balls with each solder ball extending through a respective one of said plurality of solder ball openings.

9. The WLCSP according to claim 8 further wherein said redistribution layer comprises a plurality of conductive traces with each conductive trace extending between a given bond pad and a corresponding solder ball.

10. The WLCSP according to claim 6 further wherein said semiconductor substrate comprises silicon.

11. A method for making a wafer level chip scale package (WLCSP) comprising:
   forming a back end of line (BEOL) layer on a semiconductor substrate, said BEOL layer comprising at least one insulating layer and an uppermost passivation layer, and having a peripheral edge recessed inwardly from an adjacent peripheral edge of the semiconductor substrate;
   forming a first dielectric layer over the BEOL layer and wrapping around the peripheral edge of the BEOL layer to confine the peripheral edge of the BEOL layer in compressive stress and having a peripheral edge recessed inwardly from an adjacent peripheral edge of the semiconductor substrate;
   forming a redistribution layer over the first dielectric layer; and
   forming a second dielectric layer over the redistribution layer and having a peripheral edge recessed inwardly from the adjacent peripheral edge of the first dielectric layer.

12. The method according to claim 11 wherein the uppermost passivation layer has a plurality of bond pad openings therein, and a plurality of bond pads with each bond pad exposed through a respective one of the plurality of bond pad openings.

13. The method according to claim 12 wherein the second dielectric layer has a plurality of solder ball openings therein; and further comprising a plurality of solder balls with each solder ball extending through a respective one of the plurality of solder ball openings.

14. The method according to claim 13 wherein the redistribution layer comprises a plurality of conductive traces with each conductive trace extending between a given bond pad and a corresponding solder ball.

15. The method according to claim 11 wherein the semiconductor substrate comprises silicon.

\* \* \* \* \*